US008829492B2

(12) United States Patent
Choi et al.

(10) Patent No.: US 8,829,492 B2
(45) Date of Patent: Sep. 9, 2014

(54) MULTIPLE QUANTUM DOT DEVICE AND A PRODUCTION METHOD FOR THE DEVICE

(75) Inventors: Jung Bum Choi, Cheongju-si (KR); Jong Jin Lee, Cheongju-si (KR)

(73) Assignee: Chungbuk National University Industry-Academic Cooperation Foundation, Cheongju-Si (KR)

(*) Notice: Subject to any disclaimer, the term of this patent is extended or adjusted under 35 U.S.C. 154(b) by 0 days.

(21) Appl. No.: 13/883,321

(22) PCT Filed: Nov. 25, 2010

(86) PCT No.: PCT/KR2010/008392
§ 371 (c)(1),
(2), (4) Date: May 8, 2013

(87) PCT Pub. No.: WO2012/060505
PCT Pub. Date: May 10, 2012

(65) Prior Publication Data
US 2013/0221330 A1      Aug. 29, 2013

(30) Foreign Application Priority Data

Nov. 5, 2010   (KR) .......................... 10-2010-0109652

(51) Int. Cl.
*H01L 29/66* (2006.01)
*H01L 29/76* (2006.01)
*B82Y 10/00* (2011.01)

(52) U.S. Cl.
CPC .... *H01L 29/66977* (2013.01); *H01L 29/66439* (2013.01); *H01L 29/7613* (2013.01); *B82Y 10/00* (2013.01)
USPC .......................................................... 257/39

(58) Field of Classification Search
USPC ....................... 257/39, E33.008, 14; 438/151
See application file for complete search history.

(56) References Cited

U.S. PATENT DOCUMENTS 5,679,961 A  * 10/1997  Higurashi et al. ............... 257/14
6,800,511 B2 * 10/2004  Park et al. ...................... 438/151
(Continued)

FOREIGN PATENT DOCUMENTS

JP    2003-078128    3/2003
KR    10-2001-0096861  11/2001
(Continued)

*Primary Examiner* — Thao P Le
(74) *Attorney, Agent, or Firm* — Allen, Dyer, Doppelt, Milbrath & Gilchrist, P.A.

(57) ABSTRACT

The present invention relates to a multi-quantum dot device and a method of manufacturing the multi-quantum dot device. Further specifically, present invention relates to a multi-quantum dot device including a channel configured by patterning the top silicon layer of an SOI wafer to have a P-type silicon region formed by connecting a transversal region and a longitudinal region and a plurality of N-type silicon regions; gates including a plurality of tunneling barrier gates, an end of each tunneling barrier gate is positioned on the top of a transversal side of an intersection of the transversal region and the longitudinal region of the P-type silicon region to locally control a potential in the channel; a plurality of coupling gates, an end of each coupling gate is positioned on the top of a point between the intersection and another intersection adjacent to the intersection to locally control the potential in the channel; and a plurality of sensor gates, an end of each sensor gate is positioned on the top of a center of the intersection to sense a state of a quantum dot formed at the intersection; and an inversion layer gate formed on the top of the P-type silicon region to control free electron density.

14 Claims, 7 Drawing Sheets

(56) References Cited

U.S. PATENT DOCUMENTS

| | | |
|---|---|---|
| 7,005,669 B1 * | 2/2006 | Lee .................................. 257/21 |
| 2006/0049394 A1 * | 3/2006 | Snyder et al. ................... 257/14 |
| 2007/0063182 A1 * | 3/2007 | Yang et al. ...................... 257/14 |
| 2007/0215860 A1 * | 9/2007 | Komiyama et al. ............. 257/21 |
| 2010/0006821 A1 * | 1/2010 | Choi et al. ....................... 257/20 |

FOREIGN PATENT DOCUMENTS

| | | |
|---|---|---|
| KR | 10-2002-0090068 | 11/2002 |
| KR | 10-2008-0032277 | 4/2008 |

* cited by examiner

US 8,829,492 B2

MULTIPLE QUANTUM DOT DEVICE AND A PRODUCTION METHOD FOR THE DEVICE

FIELD OF THE INVENTION

The present invention relates to a multi-quantum dot device and a method of manufacturing the multi-quantum dot device, and more specifically, to a structure of a multi-quantum dot device and a method of manufacturing thereof, which can implement practical quantum computation.

BACKGROUND OF THE RELATED ART

In order to implement quantum computation, five conditions proposed by DiVincenzo should be necessarily satisfied regardless of a physical quantity used as a unit of a material or information used for the quantum computation. First, a quantum bit, which is a basic unit of the quantum computation, should be clearly defined and can be integrated. Second, a state of the quantum can be initialized to a well-known state. Third, a coherence time of the quantum bit should be long. Fourth, a general-purpose gate should be provided for a single quantum bit and two quantum bits. Fifth, a state of the quantum bit should be measurable.

The above five conditions are factors that should be necessarily satisfied in implementing practical quantum computation, and if any one of the conditions cannot be satisfied, the practical quantum computation cannot be implemented.

Until now, a lot of methods and materials for implementing the quantum computation have been proposed. Although there are some cases in which quantum computation of a basic level is succeeded, not a case has ever been succeeded in satisfying the five conditions of DiVincenzo.

It is proved that NMR (Nuclear Magnetic Resonance) and Ion Trap, which have been most actively studied in the early stage, cannot integrate the quantum bits to a level capable of implementing the practical quantum computation. In addition, quantum dot devices using a semiconductor are currently spotlighted as a solution for the integration problem.

However, a GaAs semiconductor which is a representative quantum dot device using a semiconductor has a problem in that a spin state of electrons is easily broken due to the noises generated by nuclear spin. In addition, it is impossible to accurately control and measure a state of integrated quantum dots based on an existing structure of connecting the quantum dots in series. Accordingly, required is a quantum dot device and a method of manufacturing thereof, which can satisfy all the five conditions of DiVincenzo described above and accurately measure and control a state of each of the integrated quantum dots while the spin state of electrons is not easily broken by the nuclear spin.

SUMMARY OF THE INVENTION

Therefore, the present invention has been made in view of the above problems, and it is an object of the present invention to provide a quantum dot device and a method of manufacturing thereof, which can perform practical quantum computation by satisfying all the five conditions of DiVincenzo. In addition, there is provided a quantum dot device and a method of manufacturing thereof, which can diversely form a plurality of quantum dots by applying a voltage to a plurality of tunneling barrier gates and coupling gates owing to structural characteristics.

In addition, there is provided a quantum dot device and a method of manufacturing thereof, which can individually operate a plurality of quantum dots through the tunneling barrier gates owing to a structure of separating the source and the drain of each quantum dot from the sources and the drains of the other quantum dots. In addition, there is provided a quantum dot device and a method of manufacturing thereof, which can grasp the number of electrons in a quantum dot and a state of the quantum dot by sensing a signal using an external sensor connected to a sensor gate since each of the quantum dots independently has a sensor gate. In addition, there is provided a quantum dot device and a method of manufacturing thereof, which can control spin of electrons in a quantum dot by controlling interactions between two quantum dots by adjusting voltage of a coupling gate between the two quantum dots.

The other objects, specific advantages and new features of the present invention will be clarified further more from the following detailed descriptions and preferred embodiments in relation to the accompanying drawings.

To accomplish the above object, according to one aspect of the present invention, there is provided a multi-quantum dot device including a channel configured by patterning a top silicon layer of an SOI wafer to have a P-type (or intrinsic) silicon region formed by connecting a transversal region and a longitudinal region and a plurality of N-type silicon regions formed to have an end point connected to a transversal end of the P-type or intrinsic silicon region; gates including a plurality of tunneling barrier gates, an end of each tunneling barrier gate is positioned on a top of a transversal side of an intersection of the transversal region and the longitudinal region of the P-type (or intrinsic) silicon region to locally control a potential in the channel; a plurality of coupling gates, an end of each coupling gate is positioned on a top of a point between the intersections to locally control the potential in the channel; and a plurality of sensor gates, an end of each sensor gate is positioned on a top of a center of the intersection to sense a state of a quantum dot formed at the intersection; and an inversion layer gate formed on a top of the P-type (or intrinsic) silicon region to control free electron density.

The multi-quantum dot device including includes a first dielectric film formed on a surface of the channel for electrical insulation; and a second dielectric film formed on a surface of the gates for electrical insulation.

The first and second dielectric films are a silicon oxide film, a hafnium oxide film, a silicon nitride film or an aluminum oxide film.

The quantum dot is formed at the intersection of the P-type (or intrinsic) silicon region surrounded by the tunneling barrier gates and the coupling gates.

Free electrons are induced in the P-type (or intrinsic) silicon region by adjusting voltage applied to the inversion layer gate, and when a voltage is applied to the tunneling barrier gates and the coupling gates, the quantum dot is formed at the intersection.

Each of the quantum dots is operated by adjusting the voltage applied to the tunneling barrier gates, and electron spin in the quantum dot is controlled by controlling interactions between the quantum dots by adjusting the voltage applied to the coupling gates, and the number of electrons in the quantum dot and a state of the quantum dot are grasped by an external sensor connected to the sensor gate.

According to another aspect of the present invention, there is provided a method of manufacturing a multi-quantum dot device, the method including the steps of: patterning a top silicon layer of an intrinsic SOI wafer or a P-type SOI wafer into a shape of a channel to be configured of a P-type (or intrinsic) silicon region formed by connecting a transversal region and a longitudinal region and a plurality of N-type silicon regions, an end of each N-type silicon region is connected to an end of the P-type (or intrinsic) silicon region; manufacturing the channel by forming the N-type silicon regions by implanting a group-5 element of a high concentration into the channel, other than the P-type (or intrinsic) silicon region, through an ion implantation method; forming a first dielectric film on a surface of the channel in order to insulate the channel; forming gates including a plurality of tunneling barrier gates, an end of each tunneling barrier gate is positioned on a top of both transversal sides of an intersection of the transversal region and the longitudinal region of the P-type (or intrinsic) silicon region to locally control a potential in the channel; a plurality of coupling gates, an end of each coupling gate is positioned on a top of a point between the intersections to locally control the potential in the channel; and a plurality of sensor gates, an end of each sensor gate is positioned on a top of a center of the intersection to sense a state of a quantum dot formed at the intersection; forming a second dielectric film on a surface of the gates in order to insulate the gates; forming an inversion layer gate on a top of the P-type (or intrinsic) silicon region; and removing a portion of the first dielectric film formed on a top of the N-type silicon region and a portion of the second dielectric film formed on a top of the gates in order to attach electrodes to the channel and gates, and deposing a metal on the removed portions of the dielectric films and a portion of the inversion layer gate in order to attach the electrodes.

The patterning step includes the steps of: patterning to render a resist of a shape of the channel through a photolithography, electron-beam lithography or nano-imprint process; and etching until the top silicon layer of an area without the resist is completely removed to expose the buried oxide layer, and removing the resist.

The step of forming a first dielectric film is a step of forming the first dielectric film configured of a silicon oxide film, a hafnium oxide film, a silicon nitride film or an aluminum oxide film on a surface of the top silicon layer through a thermal oxidation, Chemical Vapor Deposition or Atomic Layer Deposition process in order to electrical insulate the channel, and the step of forming a second dielectric film is a step of forming the second dielectric film configured of a silicon oxide film, a hafnium oxide film, a silicon nitride film or an aluminum oxide film on a surface of the gates through a thermal oxidation, Chemical Vapor Deposition process or Atomic Layer Deposition process in order to electrical insulate the gates.

The step of forming gates includes the step of forming the gates by deposing a doped poly-silicon layer, forming a resist of a shape of the gates to be formed through a photolithography, electron-beam lithography or nano-imprint process, etching the poly-silicon layer and removing the resist; or forming the gates through a metal lift-off process for deposing a metal and removing the resist, after removing the resist from an area where the gates are to be formed through the photolithography, electron-beam lithography or nano-imprint process.

The step of forming an inversion layer gate is a step of forming the inversion layer gate by deposing a doped poly-silicon layer, forming a resist on the P-type (or intrinsic) silicon region through a photolithography, electron-beam lithography or nano-imprint process, etching the poly-silicon layer and removing the resist; or forming the inversion layer gate through a metal lift-off process for deposing a metal and removing the resist, after removing the resist on the P-type (or intrinsic) silicon region through the photolithography, electron-beam lithography or nano-imprint process.

The method of manufacturing a multi-quantum dot device further includes a thermal process step in the ion implantation step and the metal deposition step.

An SOI wafer having a top silicon layer from which $^{29}$Si is removed is used.

An SOI wafer having a top silicon layer from which $^{17}$O is removed is used.

The step of forming a first dielectric film forms the first dielectric film using gas and a precursor from which $^{17}$O, $^{177}$Hf and $^{179}$Hf are removed, and the step of forming a second dielectric film forms the second dielectric film using gas and a precursor from which $^{17}$O, $^{177}$Hf and $^{179}$Hf are removed.

Figure 1:
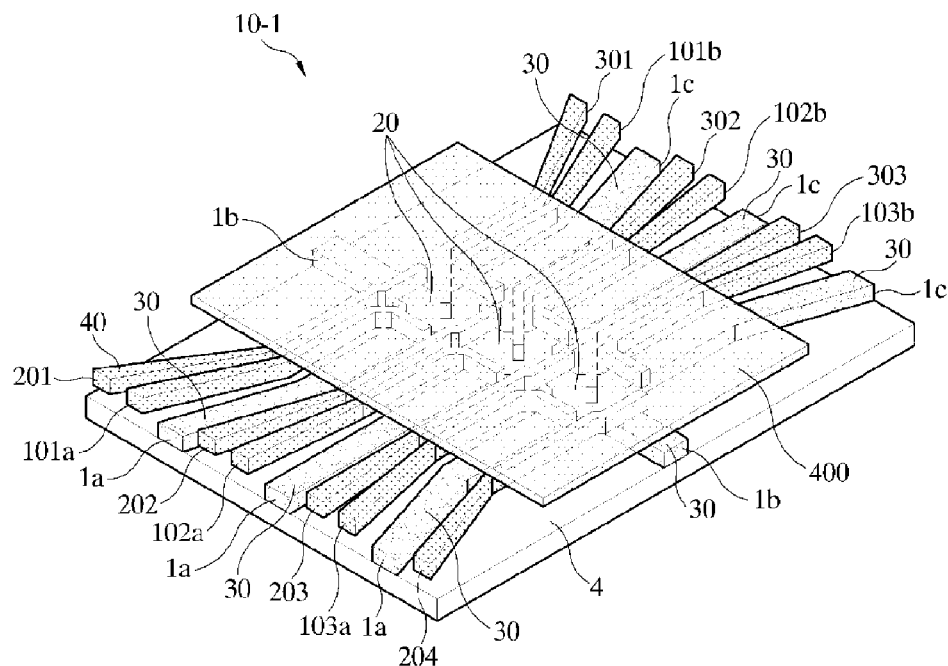
FIG. 1 is a perspective view showing a quantum dot device according to a first embodiment of the present invention.

DESCRIPTION OF SYMBOLS 1a, 1c: N-type silicon region
1b: Intrinsic or P-type silicon region
2: SOI wafer
3: Top silicon layer
4: Buried oxide layer
10-1: Quantum dot device according to first embodiment
10-2: Quantum dot device according to second embodiment
20: Quantum dot
30: First dielectric film

40: Second dielectric film
101a, 101b, 102a, 102b, 103a, 103b: Tunneling barrier gate
201, 202, 203, 204: Coupling gate
301, 302, 303: Sensor gate
400: Inversion layer gate

DETAILED DESCRIPTION OF THE PREFERRED EMBODIMENT

The preferred embodiments of the present invention that can be easily practiced by those skilled in the art will be hereafter described in detail with reference to the accompanying drawings. In addition, if already known functions or specific description of constitution related to the present invention may make the spirit of the present invention unclear, detailed description thereof will be omitted.

In the drawings illustrating the embodiments of the invention, elements having like functions will be denoted by like reference numerals and details thereon will not be repeated. Throughout the specification, when an element is connected to another element, it includes a case of indirectly connecting the elements with intervention of another element therebetween, as well as a case of directly connecting the elements. In addition, the concept of including a constitutional element means further including another constitutional element, not excluding another constitutional element, as far as an opposed description is not specially specified.

Hereinafter, the configuration of a quantum dot device 10-1 according to a first embodiment of the present invention will be described. First, FIG. 1 is a perspective view showing a quantum dot device 10-1 according to a first embodiment of the present invention, and FIG. 2 is a plan view showing a quantum dot device 10-1 according to a first embodiment of the present invention.

Figure 2:
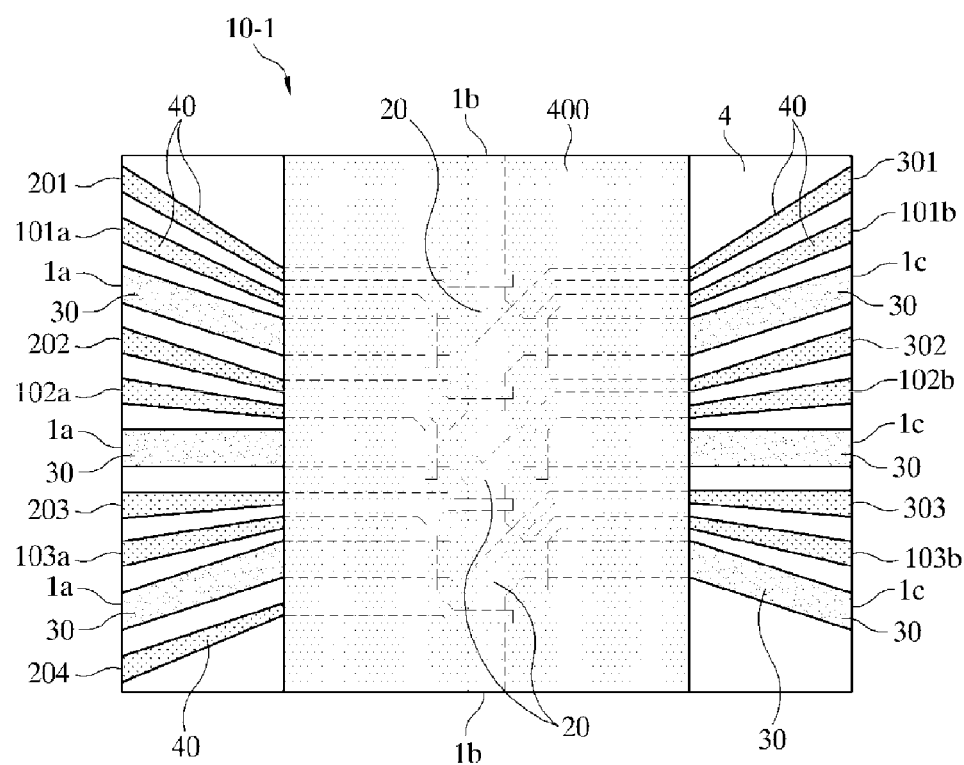
FIG. 2 is a plan view showing a quantum dot device according to a first embodiment of the present invention.

As shown in FIGS. 1 and 2, the quantum dot device 10-1 according to a first embodiment of the present invention includes a channel having a P-type (or intrinsic) silicon region 1b (hereinafter, referred to as a P-type silicon region) and N-type silicon regions 1a and 1c, tunneling barrier gates 101a, 101b, 102a, 102b, 103a and 103b and coupling gates 201, 202, 203 and 204 provided on the top of the channel and capable of locally controlling a potential within the channel, sensor gates 301, 302 and 303 used for sensing a state of a quantum dot 20, and an inversion layer gate 400 covering the entire P-type silicon region 1b and adjusting free electron density. Such a quantum dot device 10-1 may satisfy all the five conditions of DiVincenzo described above.

As shown in FIGS. 1 and 2, the channel includes a P-type silicon region 1b and N-type silicon regions 1a and 1c. Referring to FIG. 2, the P-type silicon region 1b is formed by connecting a transversal region and a longitudinal region. Then, it is understood that the N-type silicon regions 1a and 1c are formed in the shape of six branches, and an end of each N-type silicon region is connected to the P-type silicon region 1b in one piece.

In addition, a quantum dot 20 is formed at the intersection of the transversal region and the longitudinal region of the P-type silicon region 1b, and referring to FIG. 2, it is understood that the tunneling barrier gates 101a, 101b, 102a, 102b, 103a and 103b are provided at both sides of transversal regions. In a first embodiment, six tunneling barrier gates 101a, 101b, 102a, 102b, 103a and 103b are provided.

In addition, it is understood that the coupling gates 201, 202, 203 and 204 are arranged in the longitudinal direction, in which one end of each coupling gate is provided between intersections to contact with the top of the P-type silicon region. In addition, it is understood that the sensor gates 301, 302 and 303 are provided such that one end of each sensor gate is provided to contact with the top of the P-type silicon region at the center of the intersection. In addition, as shown in FIG. 1, the inversion layer gate 400 is formed on the top of the P-type silicon region 1b.

In addition, the quantum dot 20 is formed in the P-type silicon region 1b surrounded by the tunneling barrier gates 101a, 101b, 102a, 102b, 103a and 103b and the coupling gates 201, 202, 203 and 204. In addition, as shown in FIGS. 1 and 2, it is understood that the sensor gate 301, 302 or 303 for sensing a state of the quantum dot 20 is positioned right above the quantum dot 20.

Free electrons can be induced in the P-type silicon region 1b by adjusting the voltage applied to the inversion layer gate 400 of the quantum dot device 10-1. In addition, for example, if a voltage is applied to some of the tunneling barrier gates (e.g., 101a and 101b) and some of the coupling gates (e.g., 201 and 202), potential energy at a point right below the four gates 101a, 101b, 201 and 202 to which the voltage is applied is increased, and thus free electron density is lowered. Accordingly, since electrons may not exist at a certain voltage or lower, a quantum dot 20 is formed at a point surrounded by the tunneling barrier gates 101a and 101b and the coupling gates 201 and 202 to which the voltage is applied.

In addition, a plurality of quantum dots 20 may be formed by applying a voltage to other tunneling barrier gates 101a, 102a, 103a, 101b, 102b and 103b and coupling gates 201, 202, 203 and 204 in the same manner. Although only three quantum dots 20 are described in the first embodiment as show in FIGS. 1 and 2, the quantum dot 20 can be formed indefinitely by forming channels and gates of the same form in the direction above and below the coupling gate 201 and the coupling gate 204.

If the quantum dots 20 are formed in the structure described above, since the source and the drain of each quantum dot 20 are separated from the sources and the drains of the other quantum dots 20, and the tunneling barrier gates 101a, 102a, 103a, 101b, 102b and 103b operate also independently, it is easy to individually operate the indefinite number of quantum dots 20.

In addition, since each quantum dot 20 has an independent sensor gate 301, 302 or 303, the number of electrons in the quantum dot 20 and a state of the quantum dot 20 can be grasped by connecting a sensor sensitive to electric charges, such as Single Electron Transistor (SET), Quantum Point Contact (QPC), RF-SET, RF-QPC or the like, to the sensor gate 301, 302 or 303 and sensing a signal of the external sensor.

Since adjacent quantum dots 20 share the coupling gate 201, 202, 203 or 204 unlike the tunneling barrier gates 101a, 102a, 103a, 101b, 102b and 103b independently provided for each quantum dot 20, spin of electrons in the quantum dot 20 may be controlled by controlling interactions between two quantum dots 20 by adjusting voltage of the coupling gate 201, 202, 203 or 204 between the two quantum dots 20.

In addition, in order to maintain the spin state of the electrons in the quantum dot 20 for a long time, the process should be performed using an isotope having a nuclear spin of 0 if possible. Particularly, the P-type silicon region 1b where the quantum dots 20 are formed should use $^{28}$Si or $^{30}$Si having a nuclear spin of 0 without exception. In addition, it is preferable to remove an isotope which does not have a nuclear spin of 0 from oxygen, hafnium or the like used to insulate the channel. It is preferable not to use nitrogen, aluminum or the like if possible since they do not contain an isotope having a nuclear spin of 0.

As described above, since each quantum dot 20 has an independent source, drain and sensor gate 301, 302 or 303, and interactions with neighboring quantum dots 20 are controlled by the coupling gates 201, 202, 203 and 204, and a material such as a silicon wafer or the like without a nuclear spin is used, all the conditions proposed by DiVincenzo can be satisfied. Accordingly, practical quantum computation can be implemented.

Figure 3:
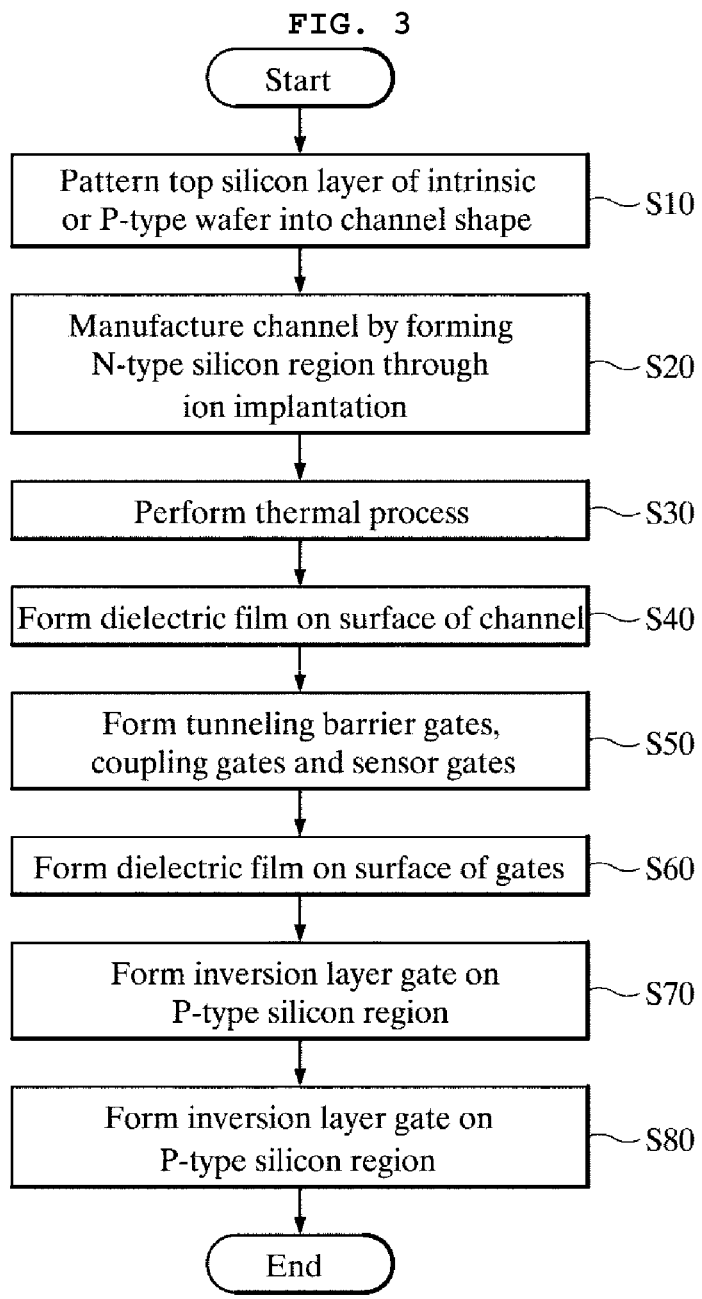
FIG. 3 is a flowchart illustrating a method of manufacturing a quantum dot device according to an embodiment of the present invention.

Hereinafter, a method of manufacturing a quantum dot device 10-1 according to a first embodiment of the present invention will be described. FIG. 3 is a flowchart illustrating a method of manufacturing a quantum dot device 10-1 according to an embodiment of the present invention.

Figure 4:
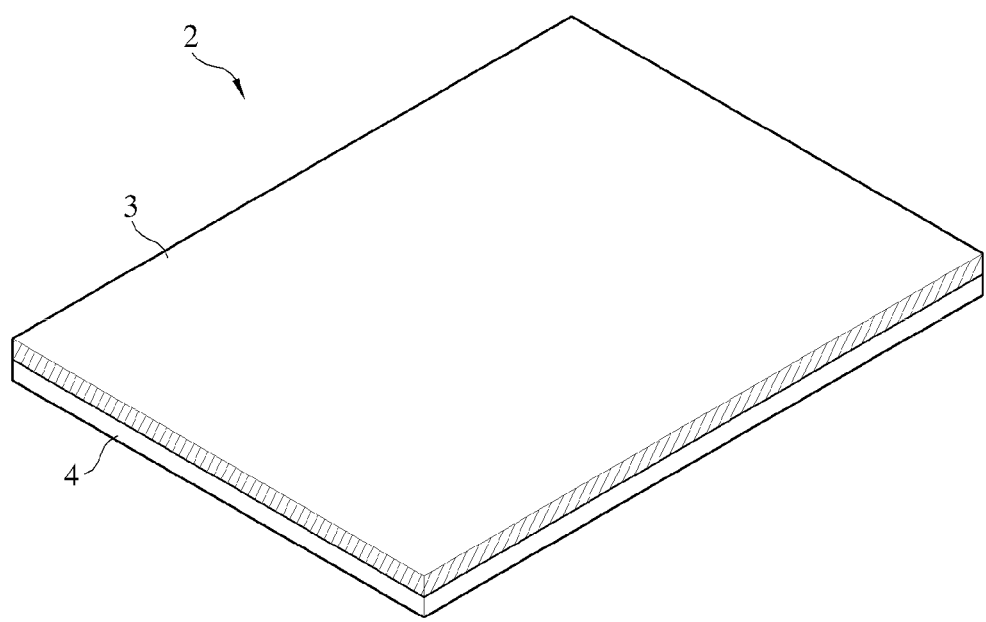
FIG. 4 is a perspective view showing an SOI wafer according to a first embodiment of the present invention.

First, an intrinsic SOI (Silicon-On-Insulator) wafer 2 or a P-type SOI wafer 2 in which a group-3 element of a low concentration such as B, Ga or the like is implanted is prepared. Such an SOI wafer 2 has a lower layer provided as a buried oxide layer 4 and an upper layer provided as a top silicon layer 3. FIG. 4 is a perspective view showing an SOI wafer 2 according to a first embodiment of the present invention. Figures and detailed descriptions of the substrate which provides only a mechanical support function will be omitted.

Then, the top silicon layer 3 of the P-type (or intrinsic) SOI wafer 2 is patterned in the shape of a channel that will be formed later S10. The top silicon layer 3 of the P-type (or intrinsic) SOI wafer 2 is patterned to render a resist thereon in the shape of a channel that will be formed later as shown in FIGS. 1 and 2, using a method such as photolithography, electron-beam lithography, nano-imprint or the like.

Then, the P-type (or intrinsic) SOI wafer 2 is etched using the resist as a mask until the top silicon layer 3 of an area without the resist is completely removed to expose the buried oxide layer 4. Then, the resist is removed. Then, the channel is manufactured by forming the N-type silicon regions 1a and 1c by implanting a group-5 element of a high concentration such as P, As or the like into the area other than the P-type silicon region 1b (i.e., an area for forming the N-type silicon regions 1a and 1c) using an ion implantation method S20.

Figure 5:
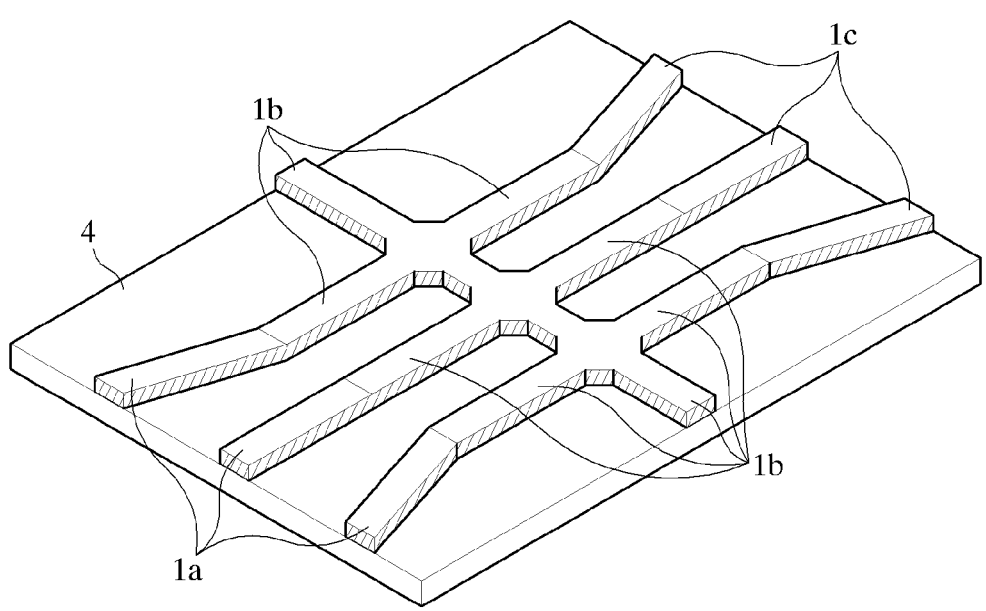
FIG. 5 is a perspective view showing a state of forming a channel having a P-type (or intrinsic) silicon region and N-type silicon regions on a top silicon layer according to a first embodiment of the present invention.

Then, a rapid thermal process is performed in order to electrically activate the implanted group-5 element S30. FIG. 5 is a perspective view showing a state of forming a channel having a P-type silicon region 1b and N-type silicon regions 1a and 1c on the top silicon layer 3 according to a first embodiment of the present invention.

Figure 6:
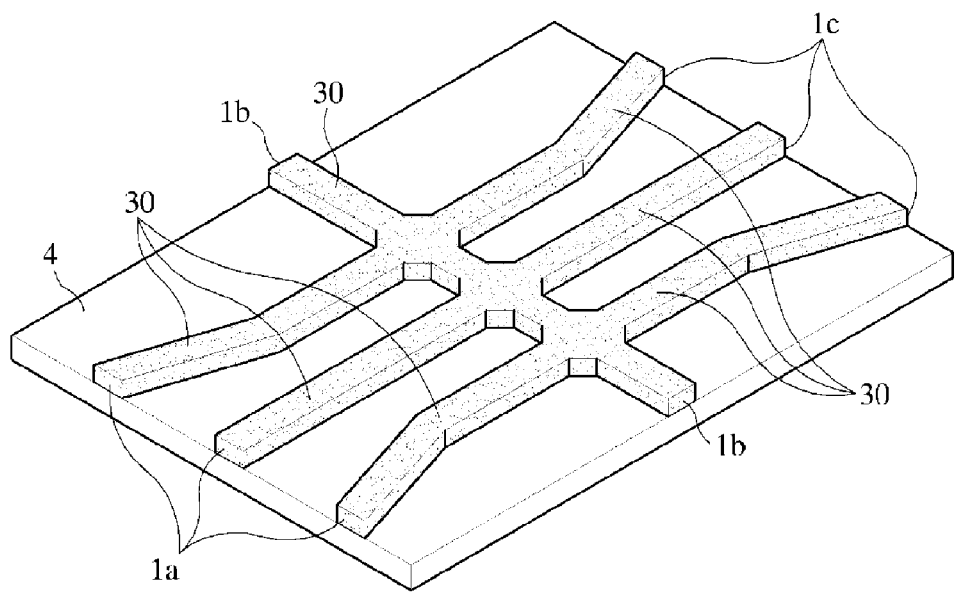
FIG. 6 is a perspective view showing a state of forming a first dielectric film on the surface of a channel according to a first embodiment of the present invention.

Then, in order to electrically insulate the channel from additionally manufactured gates, a silicon oxide $SiO_2$ film is formed on the channel surface through a thermal oxidation process, or a first dielectric layer 30, such as a silicon oxide $SiO_2$ film, a hafnium oxide $HfO_2$ film, a silicon nitride $Si_3N_4$ film, an aluminum oxide $Al_2O_3$ film or the like, is formed using Chemical Vapor Deposition (CVD) or Atomic Layer Deposition (ALD) S40. FIG. 6 is a perspective view showing a state of forming a first dielectric film 30 on the top of a channel according to a first embodiment of the present invention.

Figure 7:
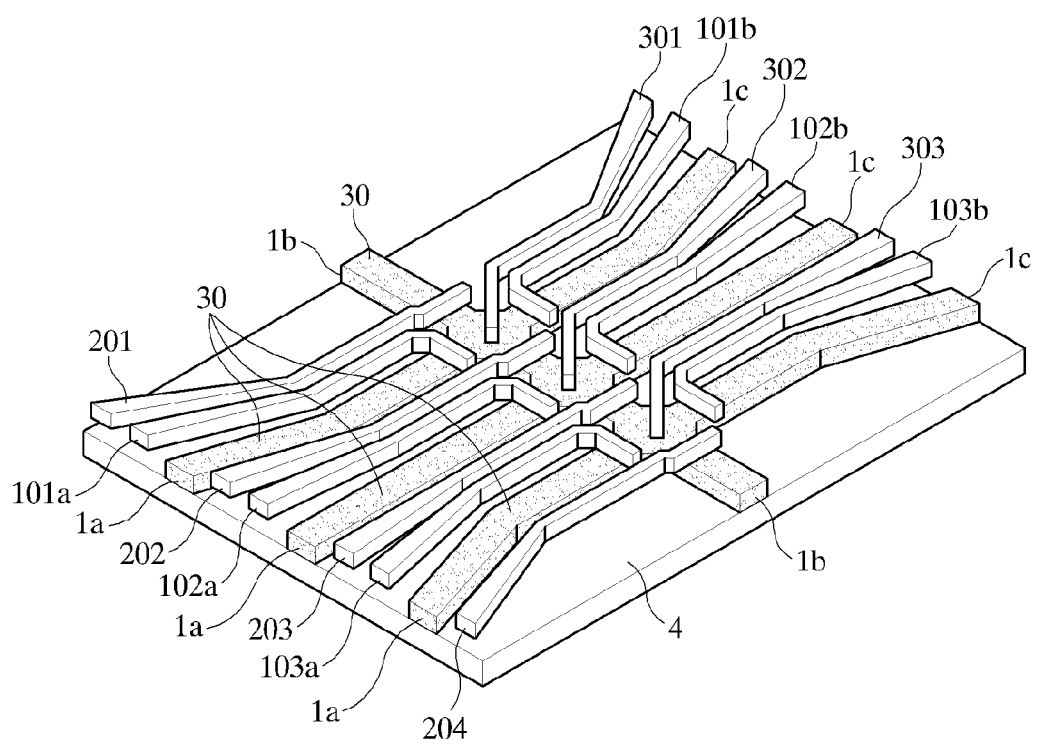
FIG. 7 is a perspective view showing a state of forming gates including tunneling barrier gates, coupling gates and sensor gates on the top of a channel according to a first embodiment of the present invention.

Then, the tunneling barrier gates 101a, 102a, 103a, 101b, 102b and 103b, the coupling gates 201, 202, 203 and 204 and the sensor gates 301, 302 and 303 are formed on the top of the channel S50. FIG. 7 is a perspective view showing a state of forming gates including tunneling barrier gates 101a, 102a, 103a, 101b, 102b and 103b, coupling gates 201, 202, 203 and 204 and sensor gates 301, 302 and 303 on the top of a channel according to a first embodiment of the present invention.

As a method of forming these gates, first, after disposing a doped poly-silicon layer, a resist of a shape of the tunneling barrier gates 101a, 102a, 103a, 101b, 102b and 103b, the coupling gates 201, 202, 203 and 204 and the sensor gates 301, 302 and 303 that will be formed is formed through a process such as photolithography, electron-beam lithography, nano-imprint or the like. Then, after etching the other area where the resist is not formed, the tunneling barrier gates 101a, 102a, 103a, 101b, 102b and 103b, the coupling gates 201, 202, 203 and 204 and the sensor gates 301, 302 and 303 are formed by removing the resist.

Second, after removing only the resist in the area where the gates are to be formed through a process such as photolithography, electron-beam lithography, nano-imprint or the like, the tunneling barrier gates 101a, 102a, 103a, 101b, 102b and 103b, the coupling gates 201, 202, 203 and 204 and the sensor gates 301, 302 and 303 can be formed through a metal lift-off process for depositing a metal and removing the resist.

Then, in order to electrically insulate the formed gates, a silicon oxide film is formed through a thermal oxidation process, or a second dielectric layer 40, such as a silicon oxide $SiO_2$ film, a hafnium oxide $HfO_2$ film, a silicon nitride $Si_3N_4$ film, an aluminum oxide $Al_2O_3$ film or the like, is formed using Chemical Vapor Deposition (CVD) or Atomic Layer Deposition (ALD) S60.

Then, the inversion layer gate 400 is formed on the P-type silicon region 1b using a metal or a doped poly-silicon S70. As a method of forming the inversion layer gate 400 on the P-type silicon region 1b, first, after deposing doped poly-silicon and forming a resist on the P-type silicon region 1b through a photolithography, electron-beam lithography or nano-imprint process, the doped poly-silicon in an area where the resist is not formed is etched. Then, the inversion layer gate 400 is formed by removing the resist.

Figure 8:
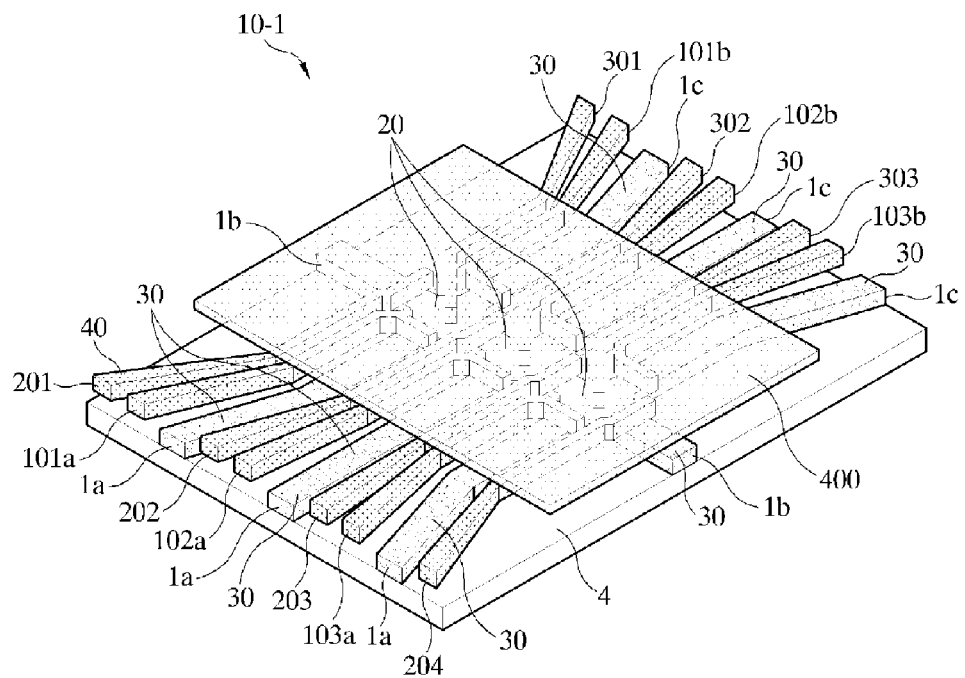
FIG. 8 is a perspective view showing a quantum dot device according to a first embodiment of the present invention.

Second, after removing the resist formed on the P-type silicon region 1b through a photolithography, electron-beam lithography or nano-imprint process, the inversion layer gate 400 can be formed through a metal lift-off process for depositing a metal and removing the resist. FIG. 8 is a perspective view showing a state of the tunneling barrier gates 101a, 102a, 103a, 101b, 102b and 103b, the coupling gates 201, 202, 203 and 204, the sensor gates 301, 302 and 303 and the inversion layer gate 400 formed on the top of the channel according to a first embodiment of the present invention.

Finally, after removing a portion of the first dielectric film 30 formed on the top of the N-type silicon region 1a or 1c farthest from the P-type silicon region 1b and a portion of the second dielectric film 40 formed on the top of the tunneling barrier gates 101a, 102a, 103a, 101b, 102b and 103b, the coupling gates 201, 202, 203 and 204 and the sensor gates 301, 302 and 303 in order to attach electrodes to the insulated channel and gates, the electrodes are formed by deposing a metal on the area, including the inversion layer gate 400, where the electrodes are to be attached. Then, a thermal process is performed in order to improve contact characteristics S80.

As described above, since the quantum dots 20 have an independent source, drain and sensor gate, and interactions with surrounding quantum dots 20 are controlled by the coupling gates 201, 202, 203 and 204, and a material such as a wafer without nuclear spin is used, all the conditions proposed by DiVincenzo can be satisfied. Accordingly, practical quantum computation can be implemented.

Hereinafter, the configuration of a quantum dot device 10-2 according to a second embodiment of the present invention will be described. First, FIG. 9 is a perspective view showing a quantum dot device 10-2 according to a second embodiment of the present invention, and FIG. 10 is a plan view showing a quantum dot device 10-2 according to a second embodiment of the present invention.

Figure 9:
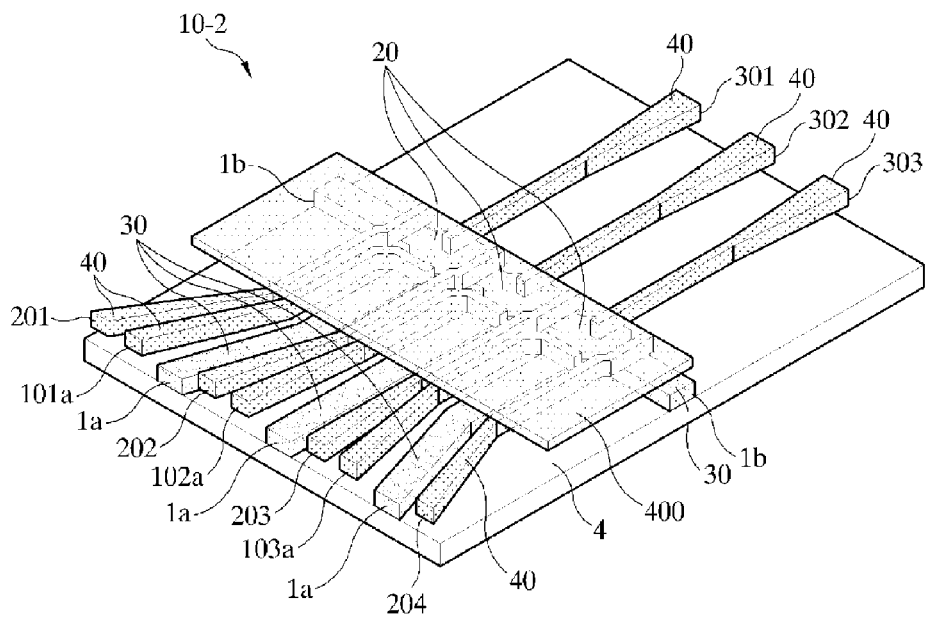
FIG. 9 is a perspective view showing a quantum dot device according to a second embodiment of the present invention.
Figure 10:
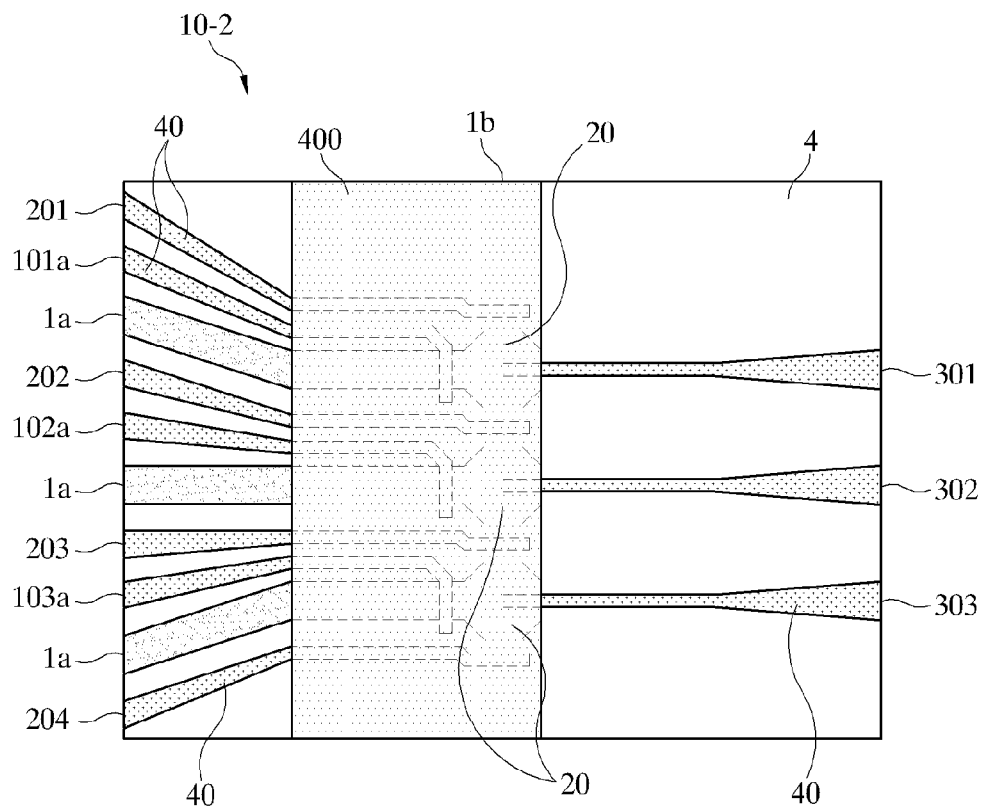
FIG. 10 is a plan view showing a quantum dot device according to a second embodiment of the present invention.

As shown in FIGS. 9 and 10, the structure and overall functions and operations of the quantum dot device 10-2 according to a second embodiment of the present invention are the same as those of the quantum dot device 10-1 according to a first embodiment described above, except that the shape of the P-type silicon region 1b is slightly different compared to the structure of the quantum dot device 10-1 according to a first embodiment, and some of the tunneling barrier gates 101b, 102b and 103b and the N-type silicon region 1c do not exist.

Referring to FIG. 10, it is understood that the P-type silicon region 1b of the quantum dot device 10-2 according to a second embodiment is formed by connecting a transversal region and a longitudinal region, and the N-type silicon region 1a is formed to be connected to the left side of the transversal P-type silicon region 1b in one piece. In addition, a quantum dot 20 is formed at the intersection of the transversal region and the longitudinal region of the P-type silicon region 1b. In addition, it is understood that the coupling gates 201, 202, 203 and 204 are respectively arranged between quantum dots 20 in the longitudinal direction along the intersections, and the tunneling barrier gates 101a, 102a and 103a are provided on the left side of each intersection, respectively.

In addition, it is understood that sensor gates 301, 302 and 303 are respectively positioned at the center of the intersection, and the inversion layer gate 400 is formed on the top of the P-type silicon region 1b. The function of the quantum dot device 10-2 according to the second embodiment is the same as that of the first embodiment. Accordingly, free electrons can be induced in the P-type silicon region 1b by adjusting the voltage applied to the inversion layer gate 400 of the quantum dot device 10-2.

In addition, for example, if a voltage is applied to some of the tunneling barrier gates (e.g., 101a) and some of the coupling gates (e.g., 201 and 202), potential energy at a point right below the three gates 101a, 201 and 202 to which the voltage is applied is increased, and thus free electron density is lowered. Accordingly, since electrons may not exist at a certain voltage or lower, a quantum dot 20 is formed at the point surrounded by the tunneling barrier gates 101a and 101b and the coupling gates 201 and 202 to which the voltage is applied.

In addition, a plurality of quantum dots 20 may be formed by applying a voltage to other tunneling barrier gates 102a and 103a and coupling gates 203 and 204 in the same manner. If the quantum dots 20 are formed in the structure described above, since the source and the drain of each quantum dot 20 are separated from the sources and the drains of the other quantum dots 20, and the tunneling barrier gates 101a, 102a and 103a operate also independently, it is easy to individually operate the indefinite number of quantum dots 20.

In addition, since each quantum dot 20 has an independent sensor gate 301, 302 or 303, the number of electrons in the quantum dot 20 and a state of the quantum dot 20 can be grasped by connecting a sensor sensitive to electric charges such as Single Electron Transistor (SET), Quantum Point Contact (QPC), RF-SET, RF-QPC or the like to the sensor gate 301, 302 or 303 and sensing a signal of the external sensor.

Since the coupling gates 201, 202, 203 and 204 share adjacent quantum dots 20 unlike the tunneling barrier gates 101a, 102a and 103a independently provided for each quantum dot 20, spin of electrons in the quantum dot 20 may be controlled by controlling interactions between two quantum dots 20 by adjusting voltage of a coupling gate 201, 202, 203 or 204 between the two quantum dots 20.

In addition, in order to maintain the spin state of the electrons in the quantum dot 20 for a long time, the process should be performed using an isotope having a nuclear spin of 0 if possible. Particularly, the P-type silicon region 1b where the quantum dot 20 is formed should use $^{28}$Si or $^{30}$Si having a nuclear spin of 0 without exception. In addition, it is preferable to remove an isotope which does not have a nuclear spin of 0 from oxygen, hafnium or the like used for insulation of the channel. It is preferable not to use nitrogen, aluminum or the like if possible since they do not contain an isotope having a nuclear spin of 0.

As described above, since each quantum dot 20 has an independent source, drain and sensor gate 301, 302 or 303, and interactions with neighboring quantum dots 20 are controlled by the coupling gates 201, 202, 203 and 204, and a material such as a silicon wafer or the like without a nuclear spin is used, all the conditions proposed by DiVincenzo can be satisfied. Accordingly, practical quantum computation can be implemented.

Hereinafter, a method of manufacturing a quantum dot device 10-2 according to a second embodiment of the present invention will be described. The method of manufacturing a quantum dot device 10-2 according to a second embodiment is basically the same as the manufacturing method of the first embodiment described above. That is, first, an intrinsic SOI (Silicon-On-Insulator) wafer 2 or a P-type SOI wafer 2 in which a group-3 element of a low concentration such as B, Ga or the like is implanted is prepared. Such an SOI wafer 2 has a lower layer provided as a buried oxide layer 4 and an upper layer provided as a top silicon layer 3.

Then, the top silicon layer 3 of the P-type (or intrinsic) SOI wafer 2 is patterned in the shape of a channel that will be formed later S10. As described above, the top silicon layer 3 of the P-type (or intrinsic) SOI wafer 2 is patterned to render a resist thereon in the shape of a channel that will be formed later as shown in FIGS. 9 and 10, using a method such as photolithography, electron-beam lithography, nano-imprint or the like.

Figure 11:
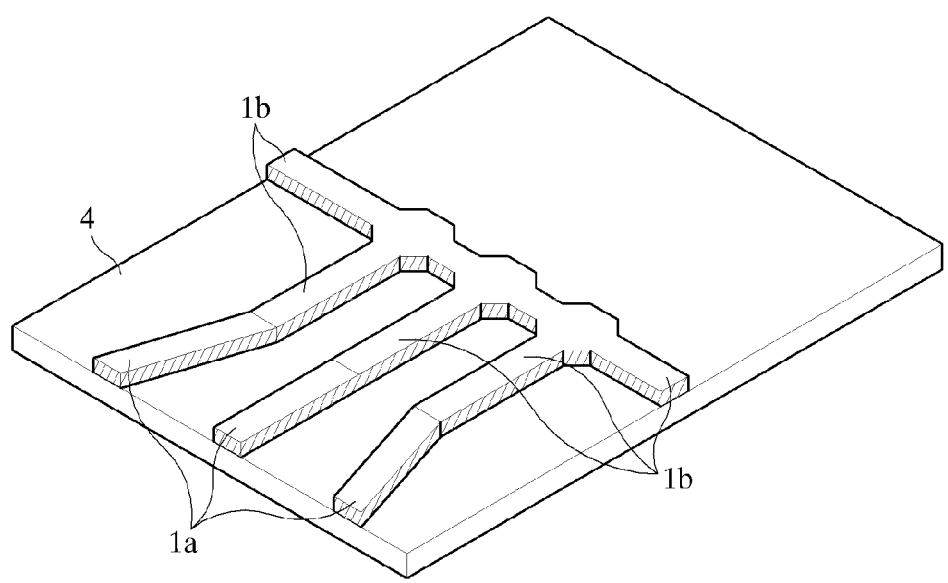
FIG. 11 is a perspective view showing a state of forming a channel having a P-type (or intrinsic) silicon region and N-type silicon regions on a top silicon layer according to a second embodiment of the present invention.

Then, the P-type (or intrinsic) SOI wafer 2 is etched using the resist as a mask until the top silicon layer of an area without the resist is completely removed to expose the buried oxide layer 4. Then, the resist is removed. Then, the channel is manufactured by forming the N-type silicon region 1a by implanting a group-5 element of a high concentration such as P, As or the like into the area other than the P-type (or intrinsic) silicon region 1b (i.e., an area for forming the N-type silicon region 1a) using an ion implantation method. FIG. 11 is a perspective view showing a state of forming a channel according to a second embodiment of the present invention. Then, a rapid thermal process is performed in order to electrically activate the implanted group-5 element.

Then, in order to electrically insulate the channel from additionally manufactured gates, a silicon oxide $SiO_2$ film is formed through a thermal oxidation process, or a first dielectric layer 30, such as a silicon oxide $SiO_2$ film, a hafnium oxide $HfO_2$ film, a silicon nitride $Si_3N_4$ film, an aluminum oxide $Al_2O_3$ film or the like, is formed using Chemical Vapor Deposition (CVD) or Atomic Layer Deposition (ALD).

Then, the tunneling barrier gates 101a, 102a and 103a, the coupling gates 201, 202, 203 and 204 and the sensor gates 301, 302 and 303 are formed on the top of the channel. As described above, as a method of forming these gates, first, after disposing a doped poly-silicon layer, a resist of a shape of the tunneling barrier gates 101a, 102a and 103a, the coupling gates 201, 202, 203 and 204 and the sensor gates 301, 302 and 303 that will be formed is formed through a process such as photolithography, electron-beam lithography, nano-imprint or the like. Then, after etching the other area where the resist is not formed, the tunneling barrier gates 101a, 102a and 103a, the coupling gates 201, 202, 203 and 204 and the sensor gates 301, 302 and 303 are formed by removing the resist.

Figure 12:
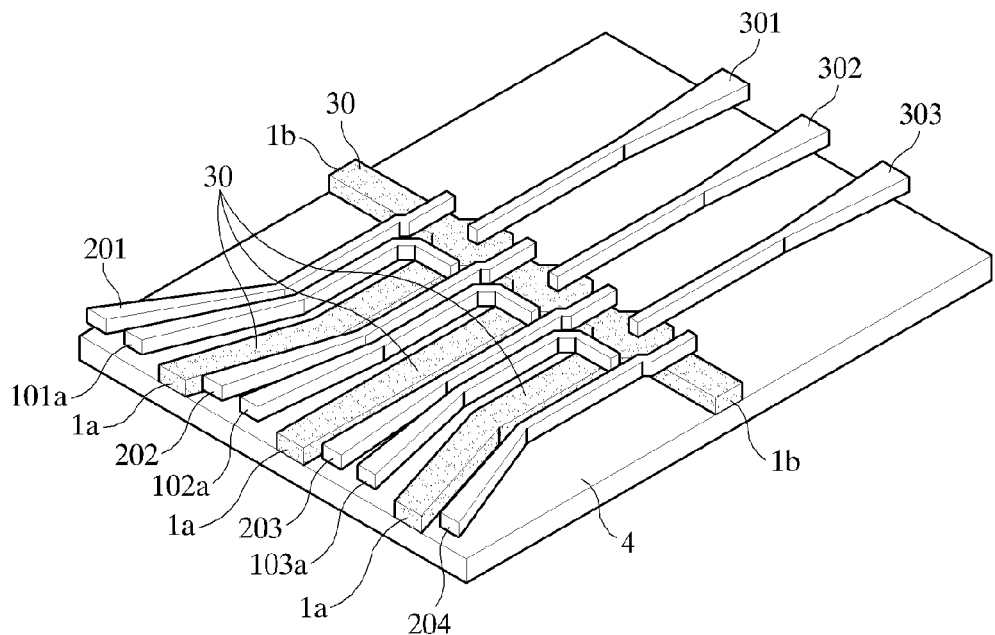
FIG. 12 is a perspective view showing a state of forming tunneling barrier gates, coupling gates and sensor gates on the top of a channel according to a second embodiment of the present invention.

Second, after removing only the resist in the area where the gates are to be formed, through a process such as photolithography, electron-beam lithography, nano-imprint or the like, the tunneling barrier gates 101a, 102a and 103a, the coupling gates 201, 202, 203 and 204 and the sensor gates 301, 302 and 303 can be formed through a metal lift-off process for depositing a metal and removing the resist. FIG. 12 is a perspective view showing a state of forming the tunneling barrier gates 101a, 102a and 103a, the coupling gates 201, 202, 203 and 204 and the sensor gates 301, 302 and 303 on the top of a channel according to a second embodiment of the present invention.

Then, in order to electrically insulate the formed gates, a silicon oxide film is formed through a thermal oxidation process, or a second dielectric layer 40, such as a silicon oxide $SiO_2$ film, a hafnium oxide $HfO_2$ film, a silicon nitride $Si_3N_4$ film, an aluminum oxide $Al_2O_3$ film or the like, is formed using Chemical Vapor Deposition (CVD) or Atomic Layer Deposition (ALD).

Then, the inversion layer gate 400 is formed on the P-type silicon region 1b using a metal or a doped poly-silicon. As described above, as a method of forming the inversion layer gate 400 on the P-type silicon region 1b, first, after deposing doped poly-silicon and forming a resist on the P-type silicon region 1b through a photolithography, electron-beam lithography or nano-imprint process, the doped poly-silicon in an area where the resist is not formed is etched. Then, the inversion layer gate 400 is formed by removing the resist.

Figure 13:
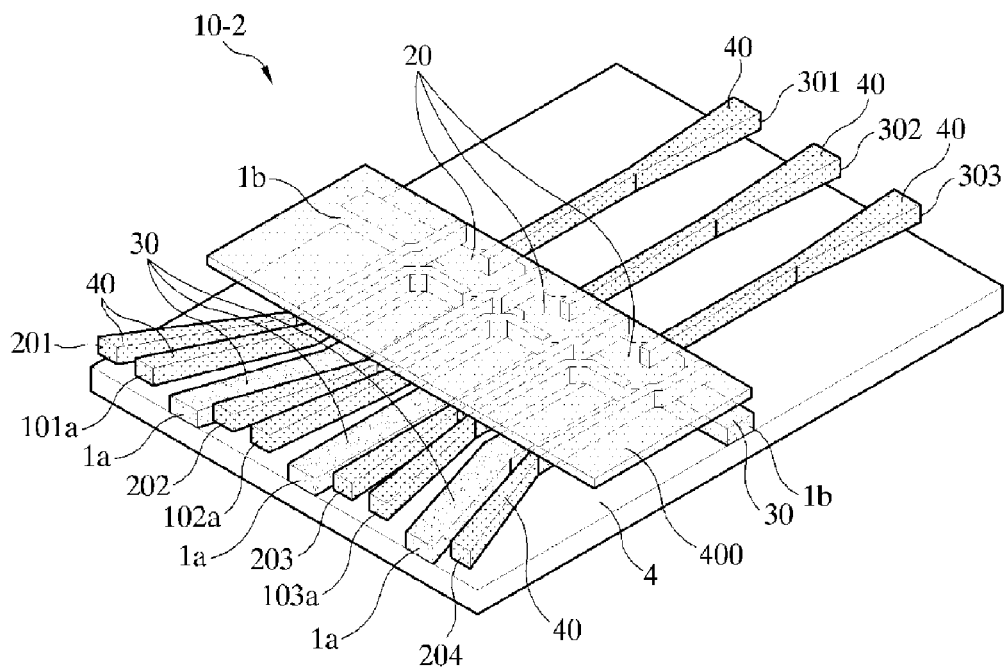
FIG. 13 is a perspective view showing a state of forming tunneling barrier gates, coupling gates, sensor gates and an inversion layer gate on the top of a channel according to a second embodiment of the present invention.

Second, after removing the resist formed on the P-type silicon region 1b through a photolithography, electron-beam lithography or nano-imprint process, the inversion layer gate 400 can be formed through a metal lift-off process for depositing a metal and removing the resist. FIG. 13 is a perspective view showing a state of the tunneling barrier gates 101a, 102a and 103a, the coupling gates 201, 202, 203 and 204, the sensor gates 301, 302 and 303 and the inversion layer gate 400 formed on the top of the channel according to a second embodiment of the present invention.

Finally, after removing a portion of the first dielectric film 30 formed on the top of the N-type silicon region 1a farthest from the P-type silicon region 1b and a portion of the second dielectric film 40 formed on the top of the tunneling barrier gates 101a, 102a and 103a, the coupling gates 201, 202, 203 and 204 and the sensor gates 301, 302 and 303 in order to attach electrodes to the insulated channel and gates, the electrodes are formed by deposing a metal on the area, including the inversion layer gate 400, where the electrodes are to be attached. Then, a thermal process is performed in order to improve contact characteristics S80.

According to an embodiment of the present invention described above, all the five conditions of the DiVincenzo can be satisfied by manufacturing a device of the proposed structure. Accordingly, since practical quantum computation can be implemented, a remarkable advancement in the information field is expected. In addition, a plurality of quantum dots can be diversely formed by applying a voltage to a plurality of tunneling barrier gates and coupling gates owing to the structural characteristics.

Furthermore, according to an embodiment of the present invention, since the quantum dot device has a structure of separating the source and the drain of each quantum dot from the sources and the drains of the other quantum dots, each of the plurality of quantum dots can be individually operated through the tunneling barrier gates. In addition, since each of the quantum dots independently has a sensor gate, the number of electrons in a quantum dot and a state of the quantum dot can be grasped by sensing a signal using an external sensor connected to the sensor gate. In addition, spin of electrons in a quantum dot can be controlled by controlling interactions between two quantum dots by adjusting voltage of a coupling gate between the two quantum dots.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

What is claimed is:

1. A multi-quantum dot device comprising:
a channel configured by patterning a top silicon layer of an SOI wafer to have a P-type or intrinsic silicon region formed by connecting a transversal region and a longitudinal region and a plurality of N-type silicon regions formed to have an end point connected to a transversal end of the P-type or intrinsic silicon region;
gates including a plurality of tunneling barrier gates, an end of each tunneling barrier gate is positioned on a top of a transversal side of an intersection of the transversal region and the longitudinal region of the P-type or intrinsic silicon region to locally control a potential in the channel; a plurality of coupling gates, an end of each coupling gate is positioned on a top of a point between the intersection and another intersection adjacent to the intersection to locally control the potential in the channel; and a plurality of sensor gates, an end of each sensor gate is positioned on a top of a center of the intersection to sense a state of a quantum dot formed at the intersection; and
an inversion layer gate formed on a top of the P-type or intrinsic silicon region to control free electron density.

2. The device according to claim 1, further comprising:
a first dielectric film formed on a surface of the channel for electrical insulation; and
a second dielectric film formed on a surface of the gates for electrical insulation.

3. The device according to claim 2, wherein the first and second dielectric films are a silicon oxide film, a hafnium oxide film, a silicon nitride film or an aluminum oxide film.

4. The device according to claim 1, wherein the quantum dot is formed at the intersection of the P-type silicon region surrounded by the tunneling barrier gates and the coupling gates.

5. The device according to claim 4, wherein free electrons are induced in the P-type or intrinsic silicon region by adjusting voltage applied to the inversion layer gate, and when a voltage is applied to the tunneling barrier gates and the coupling gates, the quantum dot is formed at the intersection.

6. The device according to claim 5, wherein each of the quantum dots is operated by adjusting the voltage applied to the tunneling barrier gates, and electron spin in the quantum dot is controlled by controlling interactions between the quantum dots by adjusting the voltage applied to the coupling gates, and the number of electrons in the quantum dot and a state of the quantum dot are grasped by an external sensor connected to the sensor gate.

7. A method of manufacturing a multi-quantum dot device, the method comprising the steps of:
patterning a top silicon layer of an intrinsic SOI wafer or a P-type SOI wafer having the top silicon layer and a buried oxide layer into a shape of a channel that will be configured of a P-type or intrinsic silicon region formed in a longitudinal direction and a plurality of N-type silicon regions, an end of each N-type silicon region is connected to an end of the P-type or intrinsic silicon region;

manufacturing the channel by forming the N-type silicon regions by implanting a group-5 element of a high concentration into the channel, other than the P-type or intrinsic silicon region, through an ion implantation method;

performing a thermal process to electrically activate the group-5 element;

forming a first dielectric film on a surface of the channel in order to insulate the channel;

forming gates including a plurality of tunneling barrier gates, an end of each tunneling barrier gate is positioned on a top of a transversal side of an intersection of the transversal region and the longitudinal region of the P-type or intrinsic silicon region to locally control a potential in the channel; a plurality of coupling gates, an end of each coupling gate is positioned on a top of a point between the intersection and another intersection adjacent to the intersection to locally control the potential in the channel; and a plurality of sensor gates, an end of each sensor gate is positioned on a top of a center of the intersection to sense a state of a quantum dot formed at the intersection;

forming a second dielectric film on a surface of the gates in order to insulate the gates;

forming an inversion layer gate on a top of the P-type or intrinsic silicon region;

removing a portion of the first dielectric film formed on a top of the N-type silicon region and a portion of the second dielectric film formed on a top of the gates in order to attach electrodes to the channel and gates, and deposing a metal on the removed portions of the dielectric films and a portion of the inversion layer gate in order to attach the electrodes; and performing a thermal process in order to improve contact characteristics.

8. The method according to claim 7, wherein the patterning step includes the steps of:

patterning to render a resist of a shape of the channel through a photolithography, electron-beam lithography or nano-imprint process; and etching until the top silicon layer of an area without the resist is completely removed to expose the buried oxide layer, and removing the resist.

9. The method according to claim 7, wherein the step of forming a first dielectric film is a step of forming the first dielectric film configured of a silicon oxide film, a hafnium oxide film, a silicon nitride film or an aluminum oxide film on a surface of the top silicon layer through a thermal oxidation, Chemical Vapor Deposition or Atomic Layer Deposition process in order to electrical insulate the channel, and the step of forming a second dielectric film is a step of forming the second dielectric film configured of a silicon oxide film, a hafnium oxide film, a silicon nitride film or an aluminum oxide film on a surface of the gates through a thermal oxidation, Chemical Vapor Deposition process or Atomic Layer Deposition process in order to electrical insulate the gates.

10. The method according to claim 7, wherein the step of forming gates includes the step of:

forming the gates by deposing a doped poly-silicon layer, forming a resist of a shape of the gates to be formed through a photolithography, electron-beam lithography or nano-imprint process, etching the poly-silicon layer and removing the resist; or forming the gates through a metal lift-off process for deposing a metal and removing the resist, after removing the resist from an area where the gates are to be formed through the photolithography, electron-beam lithography or nano-imprint process.

11. The method according to claim 7, wherein the step of forming an inversion layer gate is a step of forming the inversion layer gate by deposing a doped poly-silicon layer, forming a resist on the P-type or intrinsic silicon region through a photolithography, electron-beam lithography or nano-imprint process, etching the poly-silicon layer and removing the resist, or forming the inversion layer gate through a metal lift-off process for deposing a metal and removing the resist, after removing the resist on the P-type or intrinsic silicon region through the photolithography, electron-beam lithography or nano-imprint process.

12. The method according to claim 7, wherein $^{29}$Si is removed from the top silicon layer of the SOI wafer.

13. The method according to claim 12, wherein $^{17}$O is removed from the buried oxide layer of the SOI wafer.

14. The method according to claim 7, wherein the step of forming a first dielectric film forms the first dielectric film using gas and a precursor from which $^{17}$O, $^{177}$Hf and $^{179}$Hf are removed, and the step of forming a second dielectric film forms the second dielectric film using gas and a precursor from which $^{17}$O, $^{177}$Hf and $^{179}$Hf are removed.

* * * * *